Sept. 15, 1970 J. G. VAN SANTEN 3,529,217

PHOTOSENSITIVE SEMICONDUCTOR DEVICE

Filed June 10, 1968 3 Sheets-Sheet 1

INVENTOR

JOHANNES G.VAN SANTEN

BY

AGENT

INVENTOR
JOHANNES G. VAN SANTEN

BY Frank R. Trifari
AGENT

INVENTOR
JOHANNES G. VAN SANTEN

BY

Frank R. Trifari
AGENT 3,529,217
PHOTOSENSITIVE SEMICONDUCTOR DEVICE
Johannes Gerrit van Santen, Emmasingel, Eindhoven, Netherlands, assignor, by mesne assignments, to U.S. Philips Corporation, New York, N.Y., a corporation of Delaware
Filed June 10, 1968, Ser. No. 735,703
Claims priority, application Netherlands, July 1, 1967, 6709192
Int. Cl. H01l 15/00
U.S. Cl. 317—235 9 Claims

ABSTRACT OF THE DISCLOSURE

A photosensitive diode or transistor for incorporation in an integrated circuit is described, wherein the photosensitive pn-junction is located in a pn-junction isolated epitaxial island over a buried layer located primarily in the substrate with the photosensitive junction separated from the epitaxial-substrate interface by a distance smaller than an absorption length. The result is to reduce the leakage current in the back-biased isolation junction and improve the photosensitive efficiency.

Figure 1:
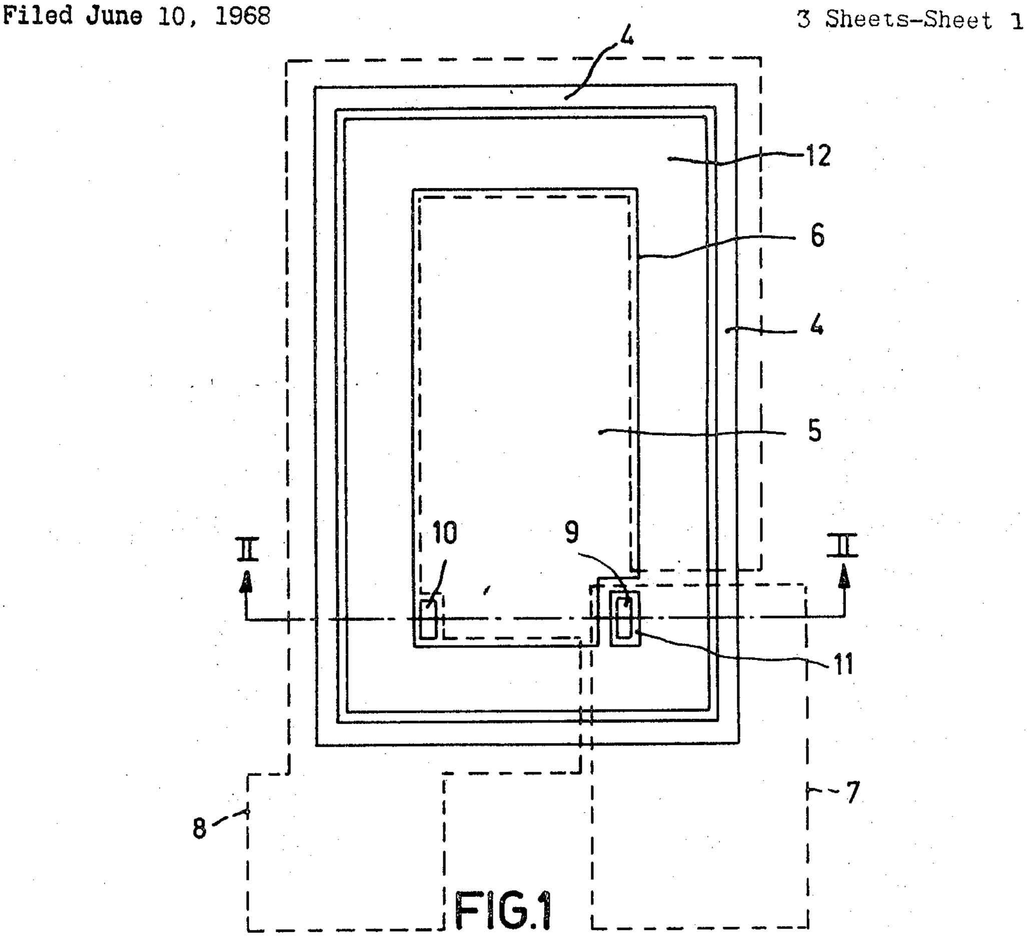

The invention relates to a semiconductor device comprising a semiconductor body, which is covered on one surface at least partially by an insulating layer and which comprises a substrate of the one conductivity type, on which an epitaxial layer of the other conductivity type is provided, which has at least one island which is separated from the other part of the layer by diffused separation or isolation channels of the one conductivity type, which extend from the surface into the substrate, whilst in the island a semiconductor element is provided which comprises a surface-adjacent zone of the one conductivity type, which is completely surrounded by the epitaxial layer of the other conductivity type and which forms therewith a pn-junction, and in the island at least one connecting conductor is provided on the epitaxial layer and at least one second connecting conductor is provided on the semiconductor surface portion surrounded by the pn-junction, whilst beneath the zone a buried layer of the other conductivity type, having a higher dope than the epitaxial layer, is provided.

Such semiconductor devices are particularly employed in integrated circuits. The island is provided with one or more circuit elements, which are separated electrically by the pn-junction, driven in the reverse direction in operation and provided between the island and the separation channels and the substrate respectively, from the circuit elements provided beyond the island concerned in or on the semiconductor body. In the said known semiconductor devices the buried layer serves for reducing the resistance between the semiconductor element concerned and the substrate. This series resistance, which may form the collector resistance of a transistor, is in most cases preferably reduced to a minimum.

The epitaxial layer of said other conductivity type has, in general, a substantially uniform thickness. The distance of the pn-junction between said zone of the one conductivity type and the epitaxial layer from the interface between the epitaxial layer and the substrate is therefore subject to a maximum value, which is determined by the thickness of the epitaxial layer.

In those cases in which said pn-junction between the zone and the epitaxial layer is a radiation-sensitive junction and is employed as such for the conversion of electromagnetic or corpuscular radiation into electrical energy, difficulties may arise due to the aforesaid restricted distance between hte radiation-sensitive junction and the substrate. These difficulties are due to the fact that the radiation incident to the surface and reaching the radiation-sensitive pn-junction through the zone of the one conductivity type gives rise to the formation of minority charge carriers in the epitaxial layer, which may arrive, by diffusion, also at the pn-junction between the eptitaxial layer or the buried layer and the substrate. These charge carriers produce a parasitic leakage current across the pn-junction between the epitaxial layer or the buried layer and the substrate, connected in the reverse direction and intended for electrical insulation.

A further disadvantage of the small relative distance of such a radiation-sensitive pn-junction from the pn-junction between the island and the substrate resides in that radiation capable of penetrating to or near the last-mentioned pn-junction may be converted in situ into charge carriers, whilst the minority charge carriers disappear mainly in the substrate under the influence of the electrical field and are not collected by the first-mentioned radiation-sensitive pn-junction so that the leakage current between the island and the substrate is further increased, whilst in addition, the efficiency of the radiation-sensitive junction is reduced.

The invention has for its object to provide a structure in which said disadvantages are avoided or at least reduced to a considerable extent.

The invention is based on the recognition that the production of a parasitic leakage current between the island and the substrate can be practically avoided by shifting, beneath the radiation-sensitive pn-junction, the pn-junction between the island and the substrate to a greater depth, whilst simultaneously a drift field is formed, which pushes minority charge carriers formed in the vicinity of the island-substrate junction towards the radiation-sensitive pn-junction.

Therefore, a semiconductor device of the kind set forth is characterized in accordance with the invention in that means are provided for causing radiation to strike said pn-junction through the zone of the one conductivity type, which radiation can be converted into electrical energy at the pn-junction, which energy can be derived between said first and second connecting conductors, in that the distance of this photo-sensitive pn-junction from the interface between the epitaxial layer and the substrate is smaller than the absorption length of the radiation to be converted, penetrating to the greatest depth, and in that the buried layer extends mainly in the substrate.

The term "absorption length" is to denote herein, as usual, the reciprocal value of the absorption constant, that is to say, the distance over which the intensity of a radiation incident to the surface of the semiconductor material has decreased due to absorption in the material to $1/e$ of the value at the surface (wherein $e$ designates the base of the natural logarithm).

The use of the invention widens considerably the possibility of integration of radiation-sensitive semiconductor elements by the reduction of the parasitic photo-current between the island and the substrate, whilst at the same time the efficiency of the radiation-sensitive pn-junction is increased. At the junction between the epitaxial layer and the more highly doped buried layer of the same conductivity type a drift field is formed, which is orientated so that minority charge carriers are pushed towards the radiation-sensitive pn-junction, where they can be collected before they can recombine with a majority charge carrier.

According as the buried layer extends more deeply into the substrate an improved effect is obtained, until finally no radiation at all penetrates to the island-substrate junction or no minority charge carriers produced at the radiation-sensitive pn-junction can any longer diffuse down to the island-substrate junction. Accordingly, a preferred device embodying the invention is characterized in that the buried layer extends in the substrate over a depth which is at least one diffusion length, preferably at least two diffusion lengths of the produced minority charge carriers.

The radiation-sensitive junction may form part of a radiation-sensitive diode, in which said zone of the one conductivity type is provided with a connecting conductor. In a further important, preferred embodiment the radiation-sensitive pn-junction forms part of a device, for example, a photo-transistor, in which inside said zone of the one conductivity type a second surface zone of the other conductivity type is provided, which is completely surrounded by the first-mentioned zone forming a second pn-junction therewith which may form the emitter of a photo-transistor, the first pn-junction forming its collector. In this case the conductor of the first zone may be omitted and only the second zone and the epitaxial layer may be provided with a conductor. The radiation-sensitive junction may furthermore form part of, for example, an opto-electronic transistor or of more complicated structures having a plurality of zones, for example, opto-electronic thyristors and the like, in which one or more of these zones are provided with connecting conductors.

In the device according to the invention the semiconductor body preferably consists of silicon which has very advantageous optical properties, in which the distance of the radiation-sensitive pn-junction from said interface is smaller than 10 $\mu$m. and the buried layer extends in the substrate over a depth of more than 5 $\mu$m.

The invention finally relates to a circuit arrangement comprising a semiconductor device of the kind described above, in which in accordance with the invention a voltage is applied in the reverse direction across the pn-junction between the island and the substrate. The radiation-sensitive pn-junction may be used without bias voltage and the photo-voltage produced by the action of incident radiation at the pn-junction can be derived from a first conductor and a second conductor and be employed for measuring or controlling purposes. As an alternative, a voltage difference may be applied between a first and a second connecting conductor, so that the radiation-sensitive pn-junction between the zone of the one conductivity type and the epitaxial layer is polarised in the reverse direction. When in this case a second surface zone of the other conductivity type is provided within the zone of the one conductivity type, said reverse voltage can be applied through connecting conductors on said second zone and on the epitaxial layer, whereas the first zone of the one conductivity type is kept floating, as for example in a photo-transistor. Moreover, the first zone may be connected as well, in which case the pn-junction between the first and the second zone may be polarised in the forward direction.

Figure 2:
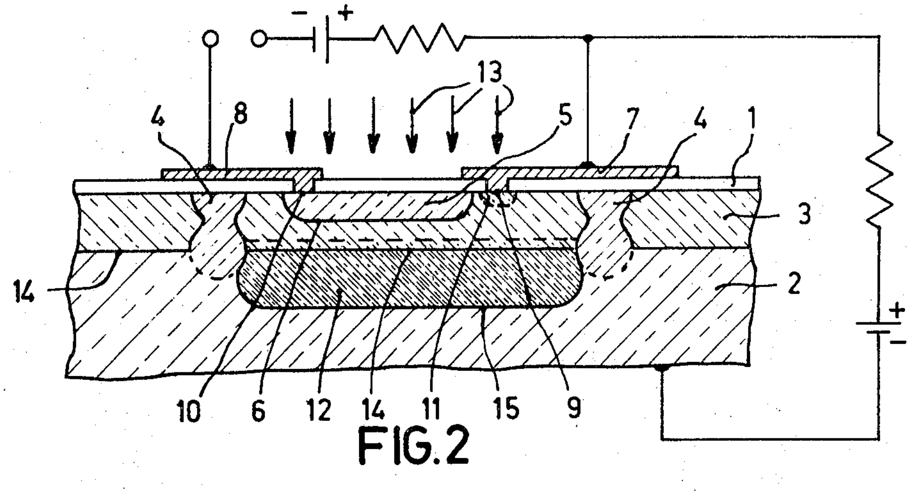
Figure 3:
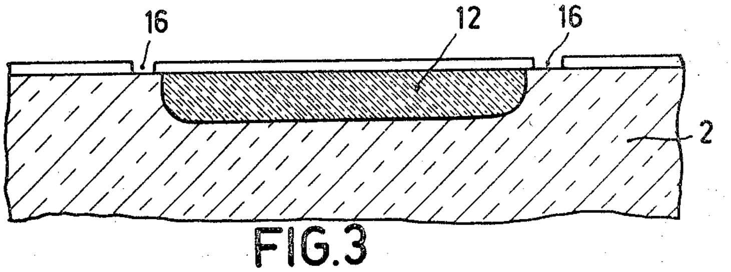
Figure 4:
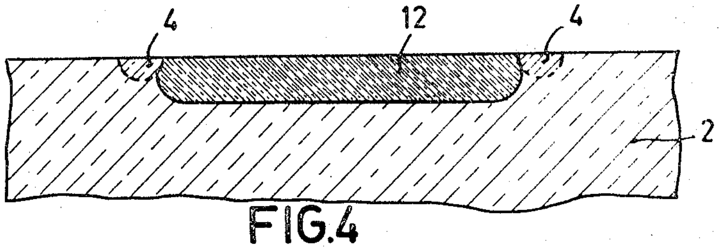
Figure 7:
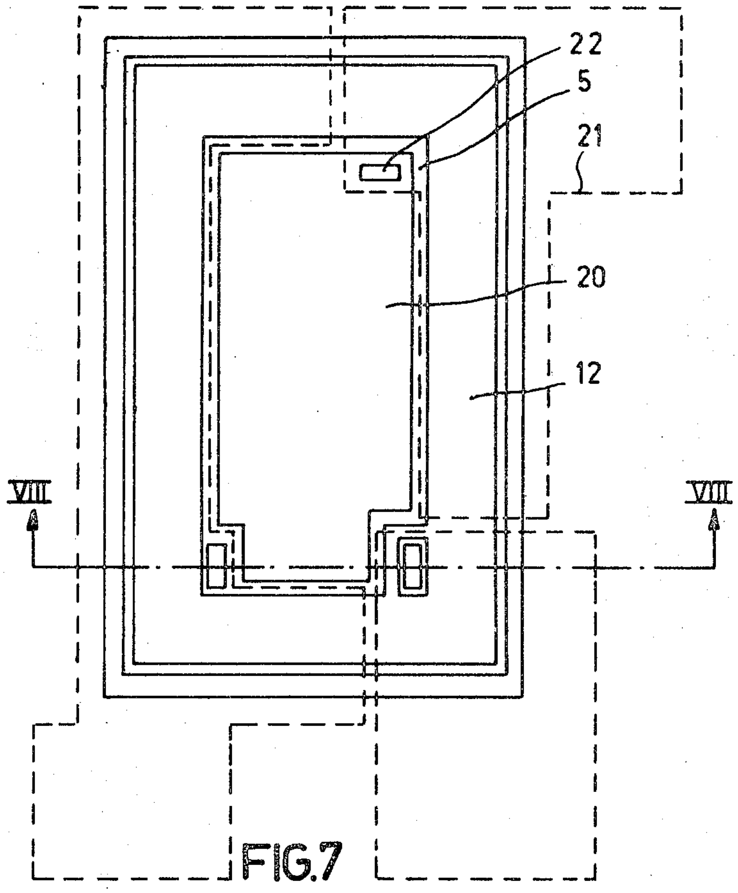
Figure 8:
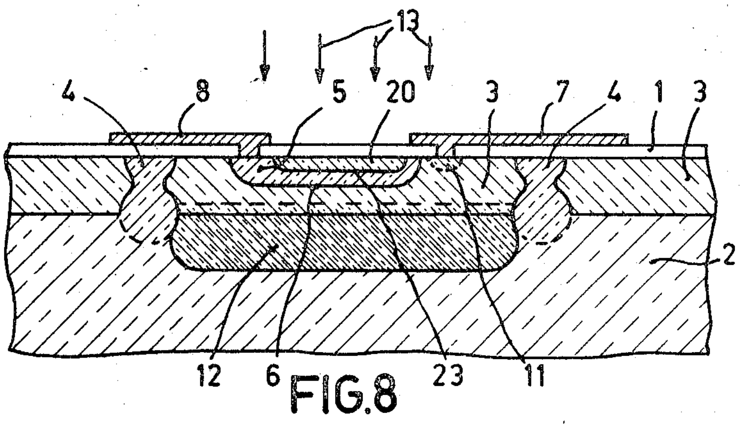

The invention will now be described more fully with reference to a few embodiments and the drawing, in which:

FIG. 1 shows schematically a plan view of a semiconductor device according to the invention, FIG. 2 is a schematic cross sectional view of the semiconductor device of FIG. 1 taken on the line II—II, FIGS. 3 to 6 are schematic cross sectional views of the semiconductor device of FIGS. 1 and 2 in consecutive stages of manufacture, FIG. 7 is a schematic plan view of a further semiconductor device according to the invention, and FIG. 8 is a schematic cross sectional view of the semiconductor device of FIG. 7 taken on the line VIII—VIII.

FIG. 1 is a plan view and FIG. 2 is a cross sectional view on the line II—II of a semiconductor device comprising a silicon semiconductor body which is covered on one surface with an insulating layer 1 of silica and which comprises a substrate 2 of p-type silicon of a resistivity of about 3 ohm.cm., on which an epitaxial layer 3 of n-type silicon is provided, which has a resistivity of 0.3 ohm.cm. and a thickness of about 10 $\mu$m. In the figures the dimensions, particularly those in the direction of thickness, are not drawn to scale for the sake of clarity. The epitaxial layer 3 has an island which is separated from the further part of the layer by diffused p-type conductive separation channels 4, which extend from the surface into the substrate 2. The island comprises a semiconductor element formed by a photo-diode having a diffused, p-type conductive zone 5 adjacent the surface and surrounded completely by the epitaxial layer 3, with which it forms a pn-junction 6. The island has furthermore on the epitaxial layer a first connecting conductor 7, formed by an aluminum contact layer, whereas a second connecting conductor 8 also formed by an aluminum layer is provided on the portion of the semiconductor surface enclosed by the pn-junction 6. The boundaries of the metal layers are indicated by broken lines in FIGS. 1 and 7. The aluminum layers 7 and 8 are located on the oxide layer 1 and join the semiconductor surface through the windows 9 and 10 and may be connected to circuit elements of the integrated circuit located beyond the island. A highly doped n-type region 11 is diffused to form a satisfactory ohmic contact on the layer 3 beneath the window 9. Beneath the zone 5 an n-type buried layer 12 is provided, which is more highly doped than the layer 3.

The major portion of the surface of the zone 5 is free of electrode layers so that an electro-magnetic radiation 13 can strike the pn-junction 6 via the zone 5 without being hindered. The radiation concerned lies in a wave range between 8000 and 4000 A. The charge carriers released by the radiation produce at the junction 6 a photo-voltage so that the incident radiation is converted into electrical energy which can be derived between the connecting conductors 7 and 8.

The vertical distance of the junction 6 from the interface 14 between the layer 3 and the substrate 2 is about 7 $\mu$m. This is smaller than the absorption length of the radiation part having the maximum penetration and the greatest wavelengths (8000 A.). The absorption length of this wavelength in silicon is about 10 $\mu$m. The buried layer 12 extends substantially completely in the substrate down to a depth of about 10 $\mu$m. The lifetime of holes in the buried layer 12 is of the order of $10^{-8}$ sec. and their diffusion constant is approximately equal to 13 $cm.^2 sec.^{-1}$, so that the diffusion length of holes in the layer 12 is about 4$\mu$m. The buried layer thus extends in the substrate over a depth exceeding two diffusion lengths of the holes produced, so that practically no minority charge carriers produced by the radiation can penetrate to the pn-junction 15 located beneath the zone 5 between the buried layer and the substrate.

In order to avoid undesirable photo-currents due to radiation incident to the boundaries of the pn-junctions 6 and 15 emerging at the surface, the aluminum layers 7 and 8 (see FIGS. 1 and 2) are formed so that they overlap substantially everywhere the pn-junctions at the surface.

In operation the pn-junction 15 is polarised in the reverse direction. This is carried out in the simplest manner by applying the lowest potential of the arrangement to the p-type substrate 2. The pn-junction 6 may be used, as stated above, without bias voltage and between the connecting conductors 7 and 8 a photo-voltage is then measured in the case of incident radiation. As an alternative a voltage may be applied in the reverse direction across the junction 6 between the connecting conductors 7 and 8 by applying a positive voltage with respect to the contact layer 8 to the contact layer 7. Then a reverse current passes between the connecting conductors 7 and 8, the value of which current varies with the intensity of the radiation.

The semiconductor device described above may be produced as follows; see FIGS. 3 to 6. A p-type silicon wafer 2 of a resistivity of 3 ohm.cm. is oxidized in wet oxygen at 1150° C. for one and a half hours. By conventional photo-resist techniques a window of 300 x 500 $\mu$m. is etched in the oxide layer. Through this window arsenic is diffused in vacuo at 1200° C. for two hours from a source of arsenic-doped silicon. Thus a surface concentration of about $5\times10^{-19}$ cm.$^{-3}$ is obtained and a penetration depth of about 2.2$\mu$m. Then the diffusion is continued in oxygen for 32 hours, so that a penetration depth of about 10 $\mu$m. is attained and the layer 12 (see FIG. 3) is obtained. The oxide layer is then etched away at the area of the separation channels to be formed (see FIG. 3), after which boron is diffused through the resultant grooves 16 of a width of about 15 $\mu$m. for 20 minutes at 950° C. and subsequently at 1180° C. in an oxidizing medium for about one hour. The result is the structure of FIG. 4 with the diffused separation channels 4.

Figure 5:
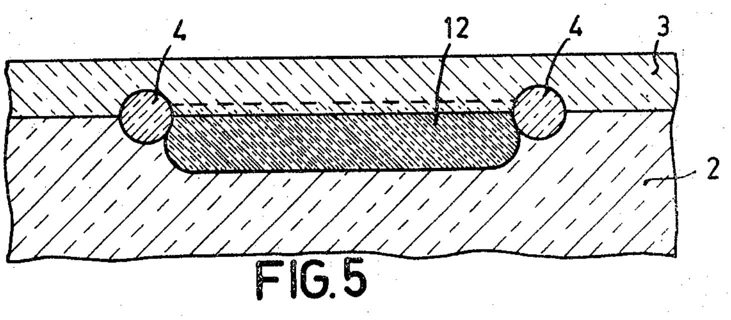
Figure 6:
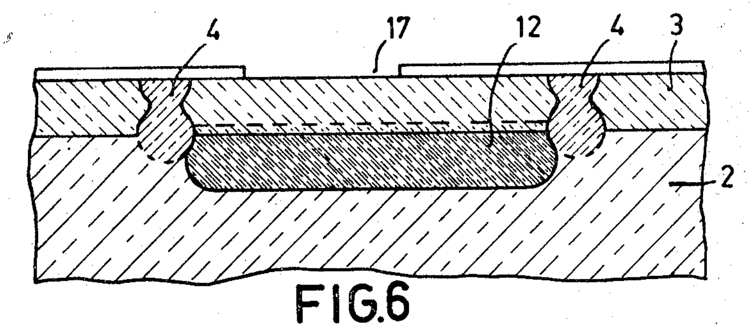

After the oxide is removed, an n-type epitaxial layer 3 of 0.3 ohm.cm. of a thickness of 10 $\mu$m. is grown at a temperature of about 1200° C. by means of generally known techniques. The boron of the separation channels 4 and to a slight extent also the arsenic of the layer 12 diffuse partially into the layer 3 so that the structure of FIG. 5 is obtained.

Then the surface is oxidized in wet oxygen at 1150° C. for 40 minutes, an oxide layer of a thickness of 0.5 $\mu$m. being formed. Grooves are again etched herein at the area of the separation channels and through the grooves boron is diffused until the separation channels 4 extend continuously from the surface into the substrate 2; see FIG. 6.

A window 17 of 200 x 400 $\mu$m. is etched in the oxide layer and boron is subsequently diffused through said window over a depth of 3 $\mu$m. in order to form the layer 5 (see FIG. 2). In the oxide layer on the surface after said diffusion a window is etched through which phosphorus is diffused to form the highly doped n-type layer 11 (see FIG. 2), which serves for establishing a satisfactory ohmic contact on the layer 3. Finally the contact windows 9 and 10 are etched in the oxide layer, after which an aluminum layer of a thickness of about 1 $\mu$m. is deposited on the whole surface from the vapour phase, in which the desired patterns of the contact layers 7 and 8 are formed by known photo-resist techniques.

FIGS. 7 and 8 are a plan view and a schematic cross sectional view on the line VIII–VIII respectively of a further semiconductor device according to the invention. This device differs from that of the FIGS. 1 and 2 in that inside the p-type conductive zone 5 a second n-type conductive surface zone 20 is diffused, which is completely surrounded by the zone 5 and which has a thickness of 1.5 $\mu$m. This zone is provided like the zones 3 and 5 with a connecting conductor 21 (see FIG. 7), formed by an aluminium layer, which joins the zone 20 through a window 22 in the oxide layer. In FIGS. 1, 2, 7 and 8 corresponding parts are designated by the same reference numerals. The device shown in FIGS. 7 and 8 is similar to that of FIGS. 1 and 2 as far as doping and thickness of the corresponding zones are concerned and it may be manufactured in a similar manner. The zones 11 and 20 may be diffused simultaneously by diffusing phosphorus at 1000° C. for 12 minutes in $POCl_3$, followed by a diffusion at 1050° C. for 15 minutes in an oxidizing medium.

The structure of FIGS. 7 and 8 may be employed as a phototransistor having an emitter zone 20, a base zone 5 and a collector zone 3. If desired, the connection of the base zone 5 may be omitted. However, since in the zone 20 for the major part short-wave radiation will be absorbed and be converted into electrical energy at the pn-junction 23, whilst radiation of longer wavelengths will penetrate through the zone 20 and be converted mainly at the pn-junction 6 due to the difference in distance from junctions 6 and 23 to the surface, the junctions 6 and 23 may be used separately as radiation-sensitive junctions for different spectral regions. For this purpose each of the zones 3, 5 and 20 have to be connected electrically. The spectral sensitivity of the device may then be controlled by means of an appropriate relative connection of the conductors 7, 8 and 21. By interconnecting the conductors 7 and 22 a parallel connection of the junctions 6 and 23 is obtained between the combination (7, 22) and 8, which connection is sensitive both to the short-wave and the long-wave spectral regions, whereas by the through-connection of 7 and 8 and of 22 and 8 respectively a circuitry of maximum sensitivity in the short-wave region and in the long-wave region respectively is obtained between each of these combinations and the remaining conductor.

It will be obvious that the invention is not restricted to the embodiments shown and that a possibility of applying many modifications is open to those skilled in the art within the scope of the invention. Instead of an electro-magnetic radiation corpsucular radiation may be measured, in which case the device according to the invention may be employed as a particle counter. Other semiconductor materials may be used instead of silicon. The semiconductor body may consist of more than one semiconductor material, in which case one or more of the junctions is(are) hetero-junctions, for example, between $A_{III}B_V$ compounds or -mixed crystals. Moreover, apart from the zone 20 (see FIG. 8) a plurality of zones may be arranged inside the zone 5, for example, for obtaining pnpn-structures and so on. The structure of FIG. 8 may furthermore also be constructed as an opto-electronic transistor in which the forwardly polarised junction 23 emits recombination radiation, which is converted at the junction 6 into charge carrier energy.

What is claimed is:

1. A radiation-responsive semiconductor device comprising a semiconductor body, said body having a substrate portion of one type conductivity and on the substrate portion an epitaxial layer portion of the opposite type conductivity and having a surface, said body further having diffused isolation channels of said one type conductivity extending from the epitaxial layer surface into the substrate portion defining at least one island portion in the epitaxial layer and separated therefrom by an isolating pn-junction, said body also having in the island a surface-adjacent zone of said one type conductivity providing with the epitaxial portion a substantially dish-shaped photosensitive pn-junction extending to the said one surface and spaced from the epitaxial layer-substrate interface a given distance, said body also having a buried layer of said opposite type conductivity and of lower resistivity than that of said epitaxial layer and extending substantially completely within the substrate and underneath the surface-adjacent zone, an insulating layer on the said surface and having an opening over the surface-adjacent zone and over the island portion, a first conductor on the insulating layer and extending through an opening into contact with the epitaxial layer surface within the photosensitive pn-junction, a second conductor on the insulating layer and extending through an opening into contact with the island portion, the major portion of said insulating layer extending over the surface-adjacent zone being free of conductors whereby incident radiation capable of pentrating the insulating layer portion will penetrate into the surface-adjacent zone, the material of said epitaxial layer having a given absorption length for the incident radiation of maximum penetration, the given distance spacing of the photosensitive pn-junction from the said interface being smaller than said given absorption length, means connected to the first and second conductors for deriving an electrical signal in response to radiation incident on the body, and means for back-biasing the isolating pn-junction, whereby undesired leakage current at the isolating junction is reduced.

2. A radiation-responsive semiconductor device as set forth in claim 1 wherein the first and second conductors are extended to cover substantially all of the isolating junction where it terminates on the surface.

3. A radiation-responsive semiconductor device as set forth in claim 2 wherein the material of the buried layer has a given diffusion length for minority charge carriers produced by the radiation, and the buried layer extends into the substrate over a depth of at least one diffusion length.

4. A radiation-responsive semiconductor device comprising a semiconductor body, said body having a substrate portion of one type conductivity and of relatively high resistivity and on the substrate portion an epitaxial layer portion of the opposite type conductivity and of relatively lower resistivity and having a surface, said body further having diffused isolation channels of said one type conductivity extending from the epitaxial layer surface into the substrate portion defining at least one island portion in the epitaxial layer and separated therefrom by an isolating pn-junction, said body also having in the island a surface-adjacent zone of said one type conductivity providing with the epitaxial portion a dish-shaped photosensitive pn-junction extending to the said one surface and spaced from the epitaxial layer-substrate interface a given distance, said body also having a buried layer of said opposite type conductivity and of lower resistivity than that of said epitaxial layer and extending substantially completely within the substrate and contiguous to the isolation channels and underneath the surface-adjacent zone, an insulating layer on the said surface and having an opening over the surface-adjacent zone and over the island portion, a first conductor on the insulating layer and extending through an opening into contact with the surface-adjacent zone, a second conductor on the insulating layer and extending through an opening into contact with the island portion, the major portion of said insulating layer extending over the surface-adjacent zone being free of conductors whereby incident radiation capable of penetrating the insulating layer portion will penetrate into the surface-adjacent zone, the material of said epitaxial layer having a given absorption length for the incident radiation of maximum penetration, the given distance spacing of the photosensitive pn-junction from the said interface being smaller than said given absorption length, the first and second conductors being extended to cover substantially all of the photosensitive and isolating pn-junctions where they terminate on the surface, means connected to the first and second conductors for deriving an electrical signal in response to radiation incident on the body, and means for back-biasing the isolating pn-junction, whereby undesired leakage current at the isolating junction is reduced.

5. A radiation-responsive device as set forth in claim 4 wherein the material of the buried layer has a given diffusion length for minority charge carriers produced by the radiation, and the buried layer extends into the substrate over a depth of at least two diffusion lengths.

6. A radiation-responsive device as set forth in claim 5 wherein a second surface zone of the opposite conductivity type is provided within the said surface-adjacent zone to form a second pn-junction.

7. A radiation-responsive device as set forth in claim 6 wherein a connecting conductor is provided to the second surface zone.

8. A radiation-responsive device as set forth in claim 4 wherein the body is of silicon, the said spacing of the photosensitive junction from the interface is less than 10 $\mu$m., and the buried layer extends in the substrate over a depth of more than 5 $\mu$m.

9. A radiation-responsive device as set forth in claim 4 and including means for back-biasing the photosensitive junction.

References Cited

UNITED STATES PATENTS 3,380,153 4/1968 Husher et al. _______ 317—235

JERRY D. CRAIG, Primary Examiner

U.S. Cl. X.R.

250—211